United States Patent [19]
Akiyama et al.

[11] Patent Number: 5,264,707
[45] Date of Patent: Nov. 23, 1993

[54] ION IMPLANTATION METHOD

[75] Inventors: Isamu Akiyama; Takanobu Fujihana, both of Kanagawa; Hiroshi Satoh, Shizuoka, all of Japan

[73] Assignee: Takata Corporation, Tokyo, Japan

[21] Appl. No.: 967,384

[22] Filed: Oct. 28, 1992

[30] Foreign Application Priority Data

Nov. 5, 1991 [JP] Japan ................. 3-288501
Nov. 5, 1991 [JP] Japan ................. 3-288502

[51] Int. Cl.$^5$ ............................ H01J 37/317
[52] U.S. Cl. .................. 250/492.3; 250/398
[58] Field of Search ............. 250/492.3, 398

[56] References Cited

U.S. PATENT DOCUMENTS 4,663,532  5/1987  Roche .................. 250/492.3

FOREIGN PATENT DOCUMENTS 61-133377  6/1986  Japan .

*Primary Examiner*—Jack I. Berman
*Attorney, Agent, or Firm*—Kanesaka and Takeuchi

[57] ABSTRACT

An ion implantation method for implanting ions by irradiating an ion beam 18 on the surface of the inner periphery 17a of a hole, characterized in that the ion beam 18 is deflected by magnetic field applied to the inside of the hole to irradiate the beam on the surface of the inner periphery 17a of the hole with an incident angle at or close to right angles. An ion implantation method for implanting ions by irradiating an ion beam 18 on the surface of the inner periphery 17a of a hole, characterized in that the ion beam 18 is irradiated on the surface of the inner periphery 17a of the hole with an incident angle at or close to right angles by inserting a lead-in tube for the ion beam to the inside of the hole and by deflecting the ion beam 18 by applying a voltage having a reverse potential to the ions on the inner surface of the hole.

6 Claims, 8 Drawing Sheets

ION IMPLANTATION METHOD

BACKGROUND OF THE INVENTION

1. Field of the Invention

The present invention relates to an ion implantation method and more particularly to a method for implanting ions on the surface of a base material aiming at improving various characteristics such as surface hardness, abrasion resistance and corrosion resistance of the material and for implanting ions homogeneously, easily and effectively even on the surface of the inner periphery of a hole having small diameter.

2. Description of the Related Art

Methods for implanting ions on the surface of a base material have been already adopted in industries aiming at improving surface hardness, abrasion resistance and corrosion resistance of the material.

FIG. 2 is a schematic structural drawing of a typical prior art ion implanting device. The device shown in the figure comprises an ion source 11, a pull-out electrode 12 and an accelerating tube 13, a mass separator 14, a convergence deflector 15 and a sample chamber 16. These are in a vacuum system and are exhausted to a certain degree of vacuum.

At first, ions composed of atoms or molecules are created in the ion source 11. Those ions are pulled out by the pull-out electrode 12 and are introduced to the accelerating tube 13. The ions introduced to the accelerating tube 13 are then provided with desired energy and enter the mass separator 14. There, only ions having desired mass are allowed to pass through to the next convergence deflector 15. The ions are converged and deflected by a lens system and electrostatic X-Y scanner (both not shown) within the convergence deflector 15 and are homogeneously irradiated to the predetermined surface of a sample 17 set on a stage 19 within the sample chamber 16. By the way, an angle of a beam 18 deflected by the scanner is several degrees at most.

Although such prior art ion implanting device as described above can implant ions on the outside surface or shallow concave portion of a member having various shapes, it cannot implant ions on the inner wall of a deep and fine tube or on a concave hole or pore having small inner diameter (hereinafter these will be referred to as "fine hole" or "pore"). Accordingly, so far, the treatment on the inner wall of concave portion of a member have been limited only to those having a shallow depth. However, there have been many requests to implement ion implantation on the inner wall of a tubular member and on the inner wall of a fine hole or pore of a member in order to improve their characteristics. As an example of that, abrasive resistance of an injection nozzle of abrasive jet made of hard metal used for overhaul of a biological shielding wall of a nuclear reactor is desired to be improved.

In order to implement ion implantation on the surface of inner wall of such a fine tube or pore, an ion beam has to be sharply bent in the inside of the fine tube or pore. Then, Japanese Patent Laid-Open No. 61-133377 disclosed a method in which an electrical repulsive force is used to implant ions on the surface of inner wall of a hole. According to this method, a positive electrode on which high voltage is applied is inserted to the inside of the hole and ions are irradiated targeting it. The ions are then diffused by the repulsion with the positive electrode and are implanted on the surface of the inner wall of the hole.

According to the method disclosed in the aforementioned Japanese Patent Laid-Open No. 61-133377, however, it is difficult to implant ions on the inner wall of a fine tube since an electrode has to be inserted to the inside of the hole and there is a restriction regarding to the inner diameter of the material to be treated. Furthermore, there is a possibility of discharge to be caused between the material to be treated and the positive electrode. Beside those, there is such a disadvantage that since the repulsion by means of the same potential with the ion beam is used, the ions may be affected by the deceleration action and thereby ions having desired energy cannot be implanted.

Accordingly, it is a primary object of the present invention to solve the aforementioned prior art problems by providing an ion implantation method having no restriction on inner diameter of a tube, hole or pore to be treated.

It is another object of the invention to provide an ion implantation method that allows energy of an ion beam to be accurately controlled without changing the energy of the ion beam and ions to be homogeneously, easily and effectively implanted even on the surface of the inner periphery of a fine tube, fine hole or pore.

SUMMARY OF THE INVENTION

An ion implantation method of a first invention of the present invention is characterized in that in a method for irradiating an ion beam on the surface of the inner periphery of a hole to implant ions, the ion beam is deflected by applying a magnetic field to the inside of the hole and is irradiated with an incident angle at or close to right angles to the surface of the inner periphery of the hole.

An ion implantation method of a second invention of the present invention is characterized in that in a method for irradiating an ion beam on the surface of the inner periphery of a hole, the ion beam is deflected by inserting a lead-in tube for the ion beam to the inside of the hole and applying a voltage having a potential reverse to the ions to the inner surface of the hole to irradiate the beam with a low incident angle at or close to right angles to the surface of the inner periphery of the hole.

By the way, in the present invention, the term "surface of the inner periphery of a hole" refers to the surface of the inner periphery of a tube, of a concave hole or of a through hole.

Referring now to FIG. 4, the principle for deflecting an ion beam by applying magnetic field in the ion implantation method of the invention will be explained.

As shown in the figure, when an ion $I_1$ having charge q and mass m runs into a magnetic field, where a magnetic field having flux density B exists, in the vertical direction (Y direction) with velocity v, the ion $I_1$ is effected by force $f=qvB$ expressed by the Fleming's left hand rule and thereby performs circular movement as shown by ion $I_2$. Radius of the gyration is expressed by $r=mv/qB$ (O in the figure is the center of the gyration). Here, if the ion is accelerated by acceleration voltage V, the radius of gyration r is expressed by $r=(2mV/qB^2)^{\frac{1}{2}}$ from a relationship between the velocity v and the acceleration voltage $Vv=(2qV/m)^{\frac{1}{2}}$. From this equation, it can be seen that the radius of gyration r is deeply related with magnitude of the magnetic field required.

By the way, in implanting ions, an angle with which an ion beam hits to a surface to be treated is very important from an aspect of efficiency of ion implantation. Then, as a preliminary test, ions were implanted by variously changing the angle with which the ion beam hits the surface to be treated to examine an angle dependency of the treatment effect (efficiency of implantation). Nitrogen ions were used for the ions to be treated and were implanted to an iron member with implantation conditions of $5 \times 10^{17}$ ions/cm$^2$ of ion implantation amount and 150 keV of acceleration voltage. For its evaluation, changes of hardness of the surface of the sample which is one of criterion for evaluating implantation effect on a metal was used. A load of 2 gf was added to an indenter during measurement of the hardness considering the depth to be treated. FIG. 5 shows the result thereof. From FIG. 5, it can be seen that the hardness is the greatest when the angle formed by the ion beam and the surface to be treated is 90° (i.e., when incident angle is 0°) and it significantly decreases when the angle deviates from that angle. From this result, it was found that it is necessary to make the incident angle of the ion beam to be almost 0° and the angle formed by the ion beam and the surface to be treated to be about 90°.

According to the ion implantation method of the first invention of the present invention, an ion beam may be effectively deflected and be homogeneously and effectively irradiated to a surface to be treated or surface of the inner periphery of a hole with almost 0° of incident angle without providing a mechanism for deflecting the ion beam within the hole portion but by providing it at outside of the member to be treated (accordingly giving no restriction on the diameter of the hole) and by means of the application of a magnetic field which exerts no change on energy of the ions.

Moreover, according to the ion implantation method of the second invention of the present invention, since the voltage having a potential reverse to the ions is applied on the surface of the inner periphery of the hole, the ion beam output from the lead-in tube for the ion beam inserted to the inside of the hole is electrically attracted to the surface of the inner periphery of the hole. Thereby, the direction of the ion beam is deflected toward the surface of the inner periphery of the hole and the ion beam is irradiated to the surface of the inner periphery of the hole with a low incident angle at or close to right angles. At this time, energy of the ions is not significantly reduced as in the prior art method in which the same potential with ions is applied.

Accordingly, the present invention which provides means for accurately controlling energy of the ions without significantly decreasing it allows the ion beam to be effectively deflected and to be homogeneously and effectively irradiated to the surface to be treated, i.e. the surface of the inner periphery of the hole, with an incident angle of almost 0°.

DETAILED DESCRIPTION OF PREFERRED EMBODIMENTS

Figure 1:
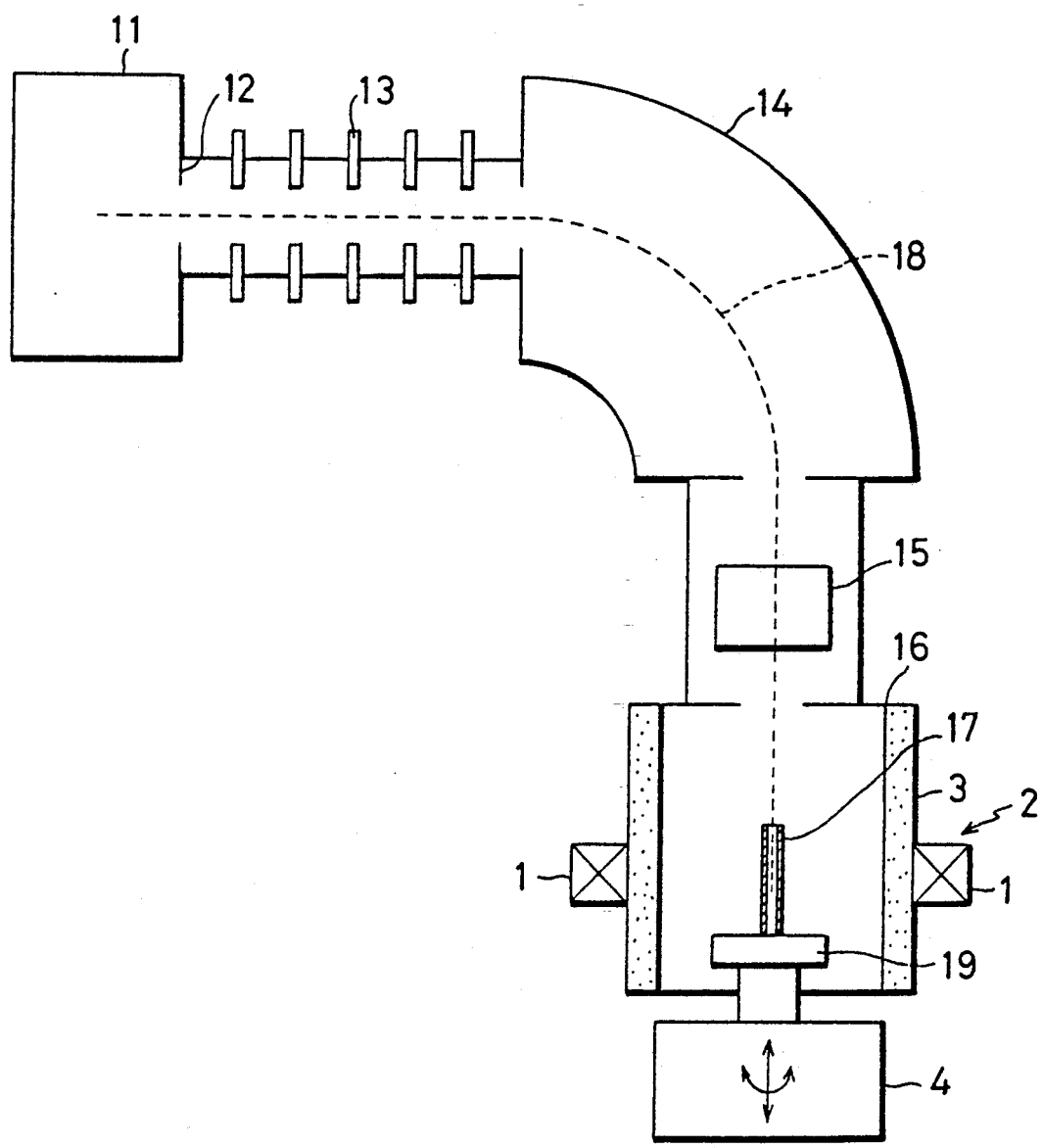
FIG. 1 is a schematic section view showing an ion implanting device which is suitable for embodying an ion implantation method of a first invention of the present invention.

Referring now to the drawings, preferred embodiments of the present invention will be explained in detail.

Figure 2:
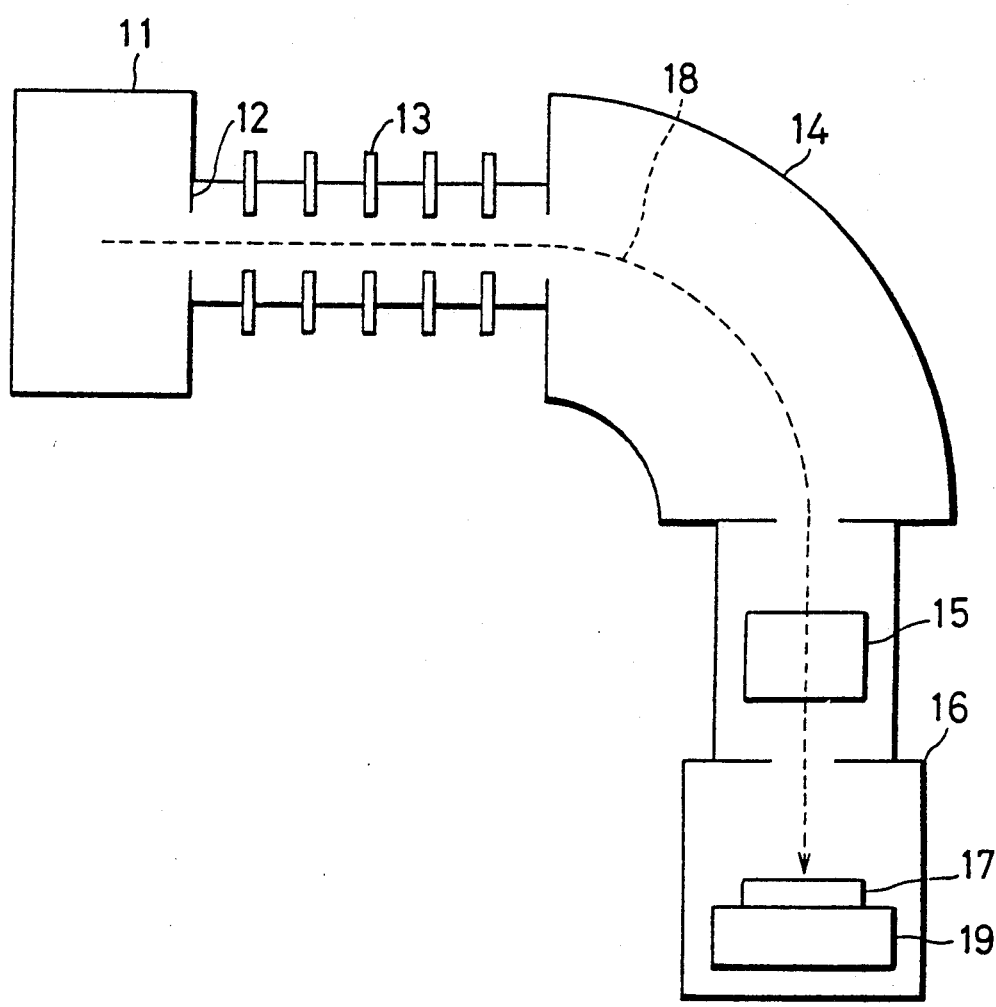
FIG. 2 is a schematic section view showing a prior art ion implanting device.
Figure 3:
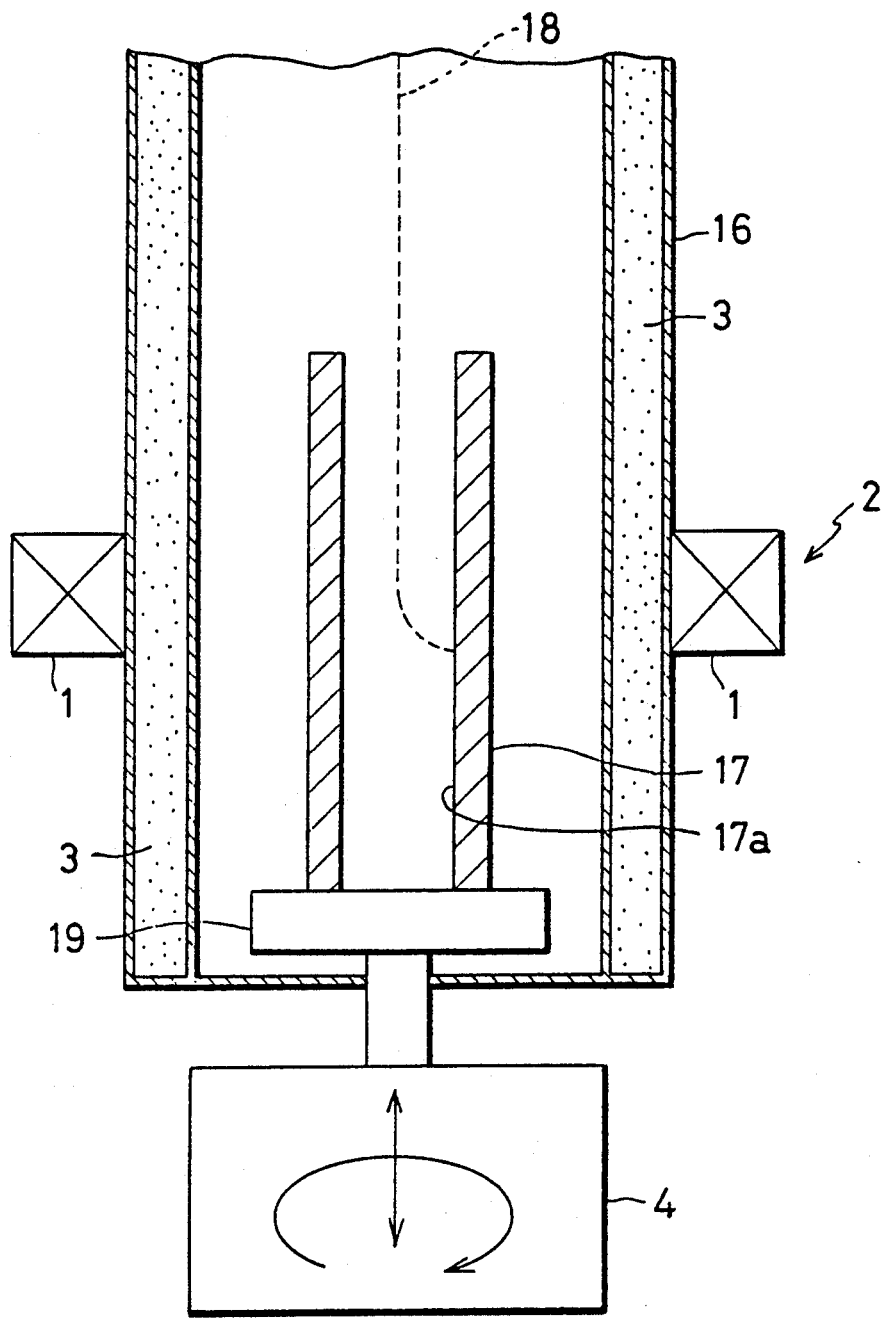
FIG. 3 is an enlarged view of a main part of the device in FIG. 1.

FIG. 1 is a schematic section view showing an ion implanting device which is suitable for embodying an ion implantation method of a first invention of the present invention and FIG. 3 is an enlarged view of a main part of the device in FIG. 1. In FIGS. 1 and 3, members having the same function with the ones in the prior art device shown in FIG. 2 are designated with the same reference number.

In the device of the present embodiment, a high angle beam deflecting mechanism 2 comprising a superconductive magnet 1 is provided at the outside of the sample chamber 16 which is a vacuum chamber. For the magnet of this beam deflecting mechanism, a composite type magnet in which a superconductive magnet and a normal conductive magnet are combined may be used.

The side wall of the sample chamber 16 constructed by double wall structure and a cooling medium (ex. liquid He, etc.) 3 for preventing overheating of the magnet 1 is allowed to flow within the double wall structure.

A driving mechanism 4 for moving up and down and rotating the stage 19 in the sample chamber 16 is provided so that ions may be automatically, homogeneously and effectively implanted to the whole surface of the inner periphery of the sample 17 by rotating and moving the sample 17 toward or back from the ion beam.

Figure 4:
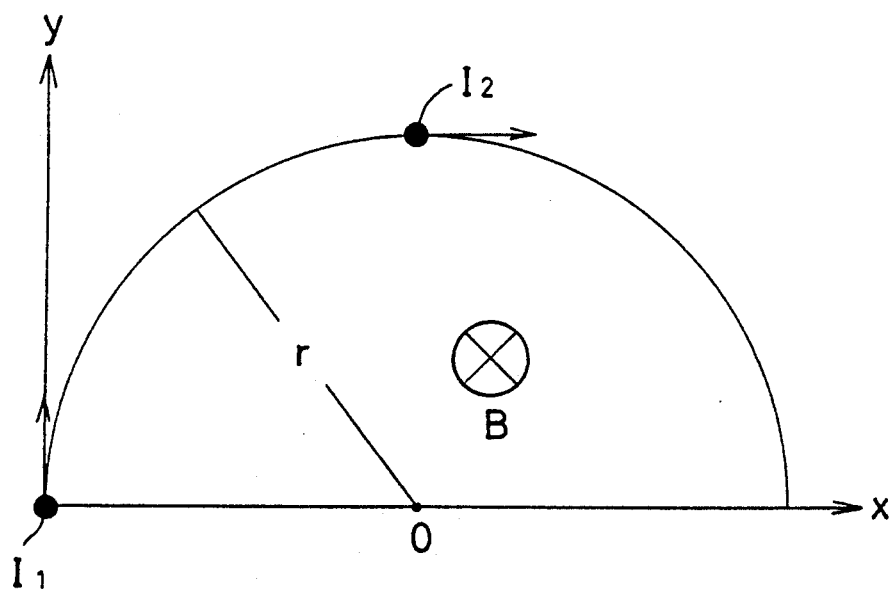
FIG. 4 is a graph for explaining the principle for deflecting an ion beam by applying magnetic field according to the first invention of the present invention.
Figure 5:
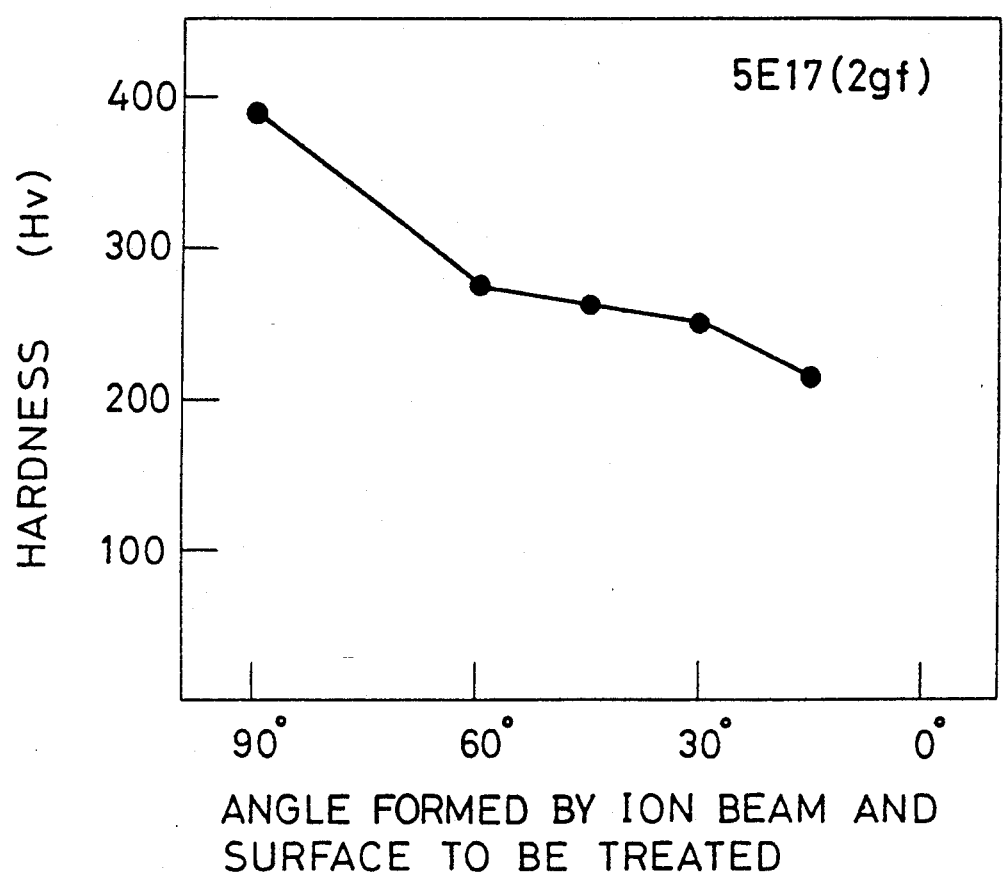
FIG. 5 is a graph showing a relationship between hardness of a surface to be treated and angle formed by an ion beam and the surface to be treated.

According to the ion implanting device as described above, the ion beam 18 is deflected by the principle explained in connection with FIG. 4 by a magnetic field applied by the magnet 1 and is irradiated to the surface of the inner periphery 17a of the tube of the sample 17 almost vertically, i.e. so that the incident angle becomes almost 0°.

Accordingly, the ion beam may be irradiated across the whole surface of the inner periphery of the tube of the sample 17 and ions be homogeneously and effectively implanted by rotating and moving up and down the sample 17 by the driver 4 during when the ion beam is irradiated.

In the first invention of the present invention, the magnitude of the magnetic field applied is appropriately determined by the size of the ion implanting device used and setting conditions. That is, the magnitude and direction of the magnetic field are set so that the ion beam is irradiated almost vertically, i.e. the incident angle becomes almost 0°, to the surface to be treated by applying the magnetic field.

Such ion implantation method allows an ion beam to be easily, effectively and homogeneously irradiated even to the surface of the inner periphery of a hole such as a fine tube, fine hole or pore whose diameter is small and which have been being considered to be difficult to implant ions thereon with an incident angle of almost 0°. Accordingly, ions may be implanted with high ion implantation efficiency and various characteristics such as hardness, abrasion resistance and corrosion resistance of the surface to be treated may be remarkably improved.

Especially the method in claim 2 or claim 3 in particular allows an ion beam to be deflected more effectively and its incident angle to be reduced to almost 0°.

Figure 6:
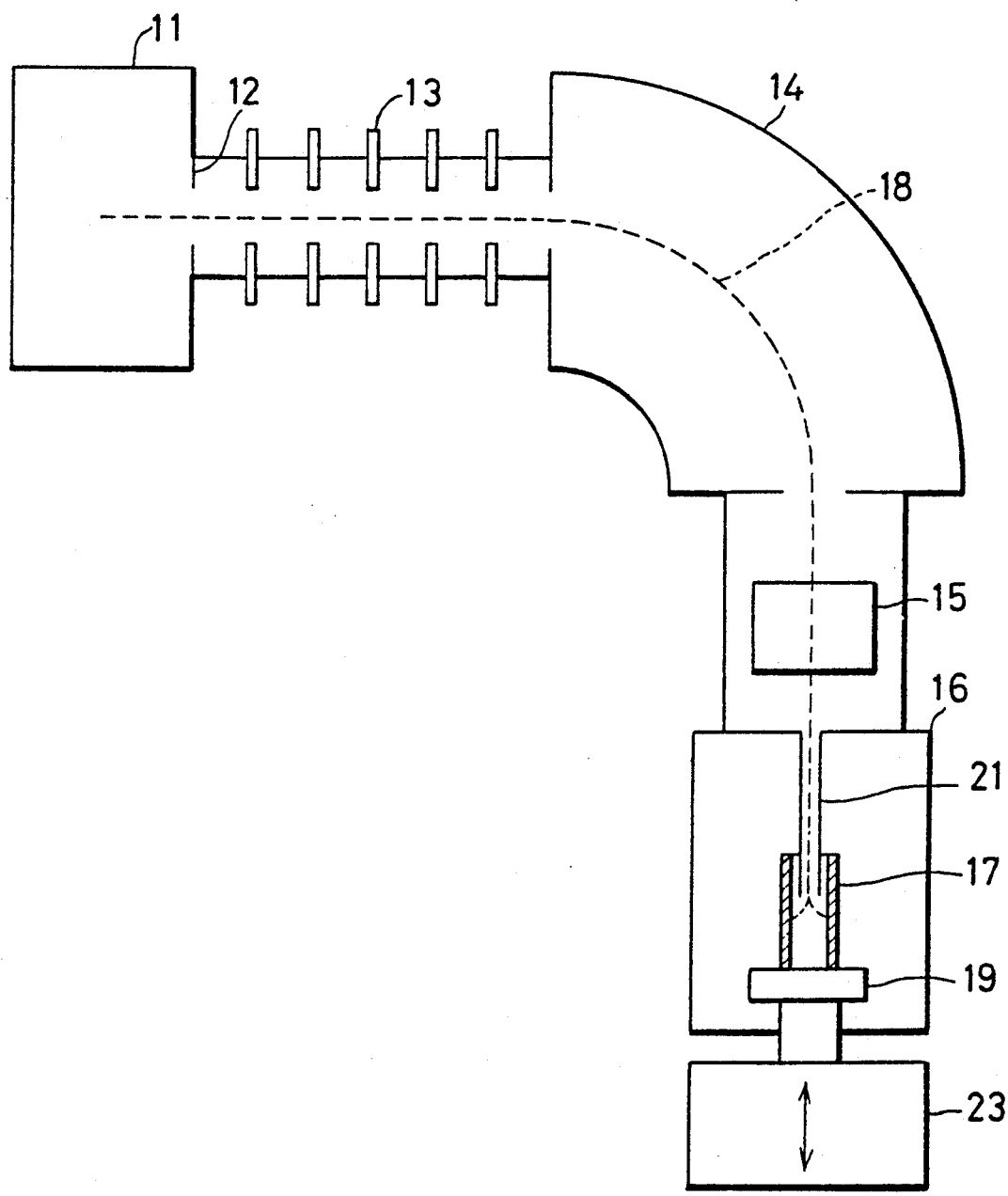
FIG. 6 is a schematic section view showing an ion implanting device which is suitable for embodying an ion implantation method of the second invention of the present invention.
Figure 7:
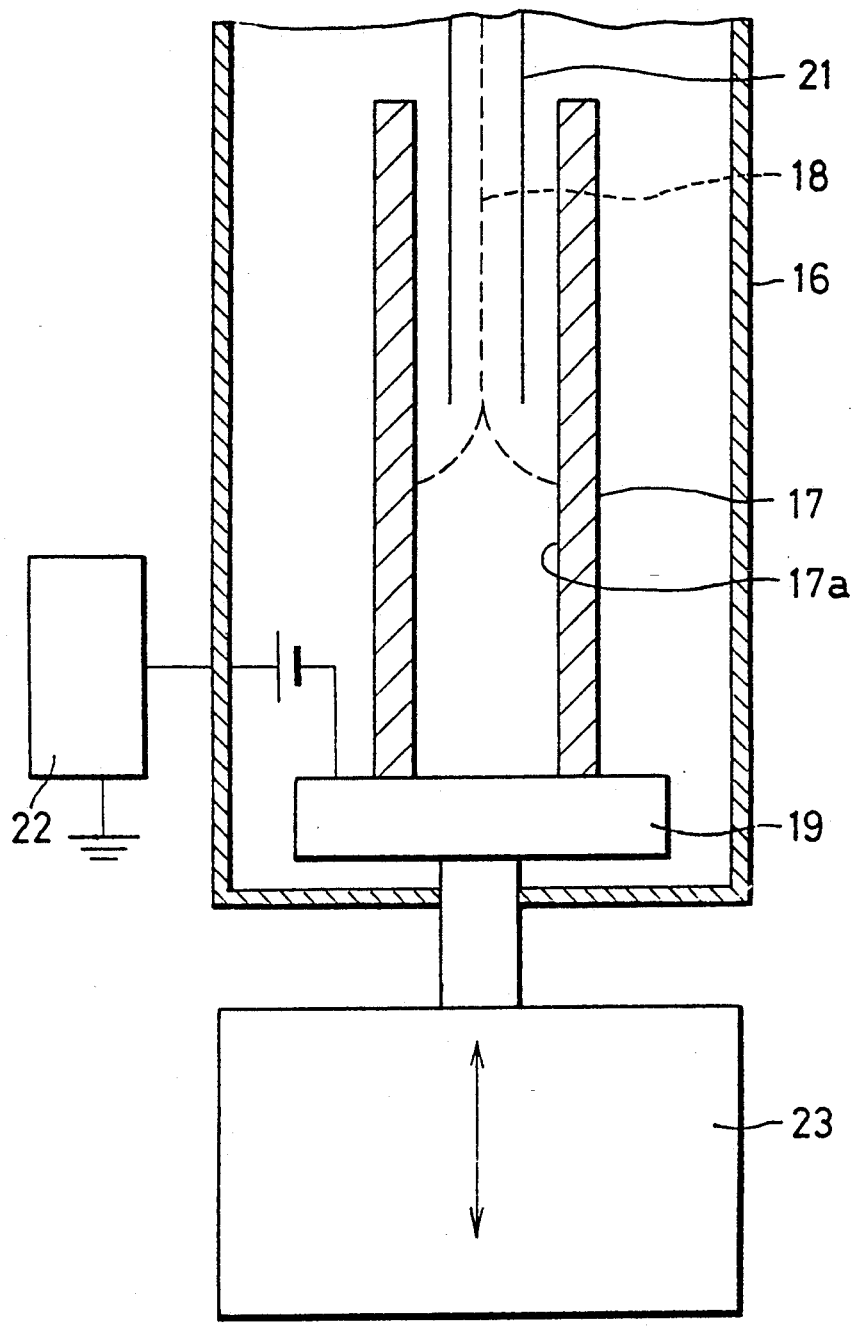
FIG. 7 is an enlarged view of a main part of the device in FIG. 6.
Figure 8:
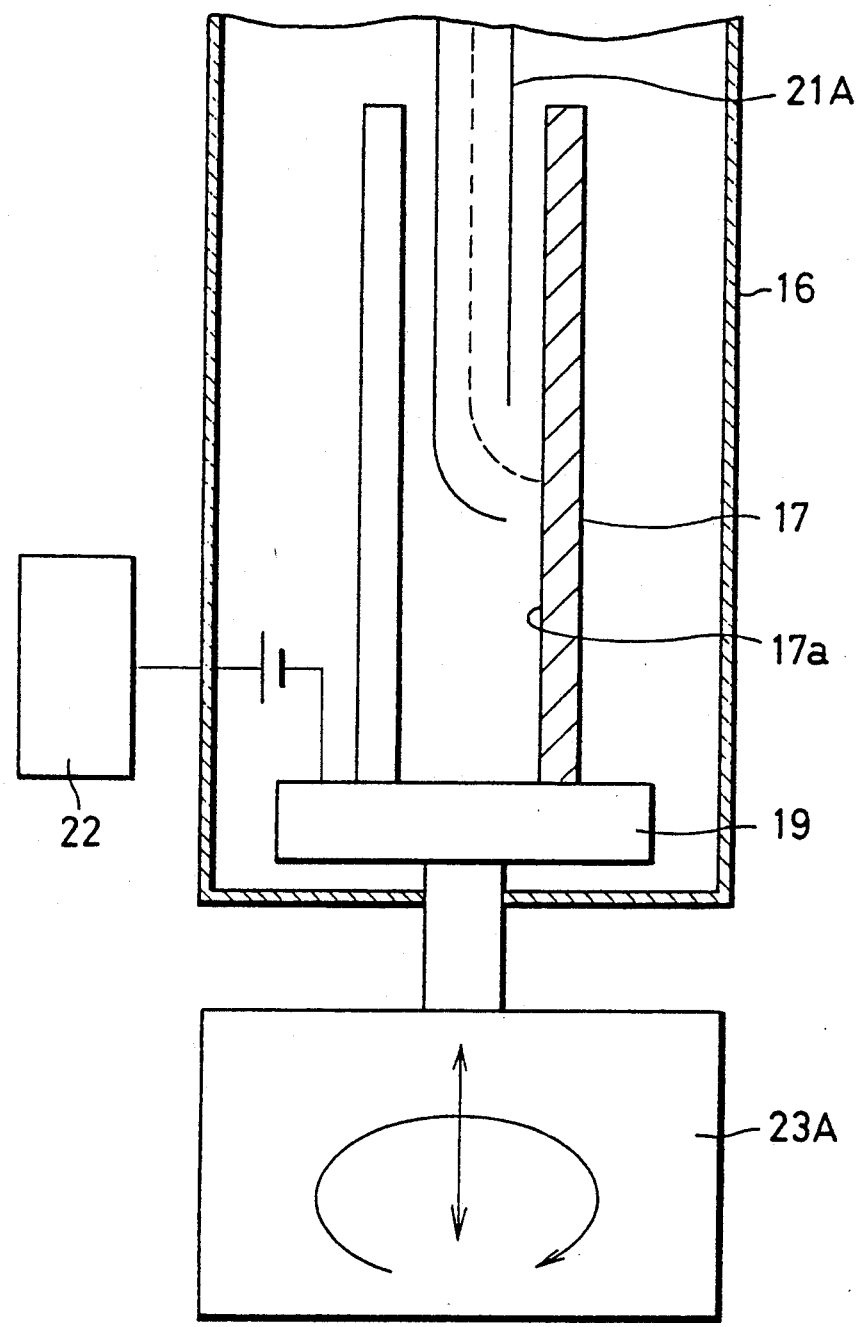
FIG. 8 is a schematic section view of another example of the ion implanting device which is suitable for embodying the ion implantation method of the second invention of the present invention.

Referring now to FIGS. 6 through 8, preferred embodiments of a second invention of the present invention will be explained in detail.

FIG. 6 is a schematic section view showing an ion implanting device which is suitable for embodying an ion implantation method of the second invention of the present invention. FIG. 7 is an enlarged view of a main part of the device in FIG. 6. FIG. 8 is a schematic section view of another example of the ion implanting device which is suitable for embodying the ion implantation method of the second invention of the present invention. In FIGS. 6 through 8, members having the same function with the ones in the prior art device shown in FIG. 2 are designated with the same reference number.

In the device shown in FIGS. 6 and 7, a lead-in tube 21 for leading the ion beam 18 is provided dropping from the sample chamber 16 which is a vacuum chamber and an edge of the lead-in tube 21 is inserted to the inside of a fine tube, a sample 17. For the lead-in tube 21, a voltage with the same potential with the ions may be applied (i.e., positive potential if the ions are positive and negative potential if the ions are negative).

The stage 19 within the sample chamber 16 is connected to a power source 22, so that a voltage having a reverse potential to the ions of the ion beam 18 is applied to the sample 17 through the intermediary of the stage 19. A driving mechanism 23 for moving the stage 19 up and down is mounted and by moving the sample 17 forward and backward to/from the ion beam, ions may be automatically, homogeneously and effectively implanted on the whole surface of the inner periphery of the sample 17.

The use of such ion implanting device allows the ion beam 18 output from the lead-in tube 21 to be attracted to the surface of the inner periphery 17a of the sample 17 charged with the reverse potential to the ions and by deflecting the irradiation direction of the ion beam 18, it is irradiated to the surface of the inner periphery 17a of the sample 17 almost vertically, i.e. with almost 0° of incident angle. At this time, the ion beam 18 is homogeneously distributed on the surface of the inner periphery of the sample and is irradiated thereon in a ring shape.

Accordingly, the ion beam may be irradiated almost vertically across the whole surface of the surface of the inner periphery 17a of the sample 17 and the ions may be homogeneously and effectively implanted as described above by moving the sample 17 up and down by driving by the driver 23 during when the ion beam is irradiated.

An ion implanting device shown in FIG. 8 has the same structure with the devices shown in FIGS. 1 and 3 except that an edge of a lead-in tube 21A is bent in one direction and that a driving mechanism 23A rotates and moves the stage 19 up and down.

The use of the ion implanting device of this embodiment also allows the ion beam 18 output from the lead-in tube 21A to be attracted to the surface of the inner periphery 17a of the sample 17 charged with the reverse potential to the ions and by deflecting the irradiation direction of the ion beam 18, it irradiated to the surface of the inner periphery 17a of the sample 17 almost vertically, i.e. with almost 0° of incident angle, as shown in the figure. At this time, the ion beam is irradiated to one spot on the surface of the inner periphery of the sample.

Accordingly, the ion beam may be irradiated almost vertically across the whole surface of the surface of the inner periphery 17a of the sample 17 and the ions be homogeneously and effectively implanted as described above by rotating and moving the sample 17 up and down by driving by the driver 23A during when the ion beam is irradiated.

In the second invention of the present invention, the degree of the voltage applied to the surface of the inner periphery of the hole is appropriately determined in accordance to the size of the ion implanting device used and the setting conditions. That is, the degree of the voltage is set so that the application of the voltage allows the ion beam to be irradiated almost vertically, i.e. with almost 0° of incident angle, to the surface to be treated. By the way, the material of the lead-in tube for leading the ion beam should be adequately determined so that the ion beam runs straight through the tube in the axial direction of the tube and so that the ion beam will not influenced by the voltage applied to the surface of the inner periphery of the hole.

Such ion implantation method of the second invention of the present invention allows the ion beam to be easily, effectively and homogeneously irradiated even on the surface of the inner periphery of a hole such as a fine tube, fine hole or pore whose diameter is small and which have been considered to be difficult to implant ions thereon with an incident angle of almost 0°. Accordingly, ions may be implanted with high ion implanting efficiency across the whole surface of the inner periphery of hole of various members and various characteristics such as hardness, abrasion resistance and corrosion resistance of the surface to be treated may be remarkably improved.

By the way, the examples shown in FIGS. 6, 7 and 8 are preferred embodiments of the present invention and the present invention is not limited to what shown in the figures.

For example, the direction of the ion beam after separating mass in the mass separator 14 may be horizontal. However, as shown in the figures, since it becomes easier to set the sample, it is very advantageous to take the vertical direction toward the ground. Especially it is very advantageous in the method of the first invention since it becomes easier to design the magnetic field for deflecting beam in high angle, thereby allowing to construct the device in lower cost.

It is also possible to treat the whole surface of the inner periphery of the sample by changing the position or direction of the magnetic field or by changing the position of the lead-in tube or degree of the voltage applied to the surface of the inner periphery of the hole, instead of rotating or moving the sample up and down by the driver.

The methods of the present invention may be easily and economically embodied by providing such mechanism for applying magnetic field, lead-in tube and power source to an existing ion implanting device.

Needless to say, such method of the present invention is also applicable to devices which have no mass separator provided as a device for implanting nitrogen ions.

The present invention will be explained more concretely exemplifying experimental examples below.

Experimental example 1

Ions were implanted by the device shown in FIGS. 1 and 3 in accordance to the method of the present invention.

That is, a magnetic field was applied in order to implant monovalent nitrogen ions vertically on the inner wall of a non-magnetic iron fine tube with 3 cm of inner diameter by 50 keV of acceleration voltage. Since the average of the radiuses of gyration of the ions at this time may be 1.5 cm (since the inner diameter is 3 cm, the radius of gyration is $3 \div 2 = 1.5$ cm), about 8 tesla of magnetic field was generated in the high angle beam deflecting magnet. By the way, heavier ions having higher acceleration voltage may be implanted if a higher magnetic field is generated in the magnet.

The hardness of the surface treated became about Hv 300 which is about 1.5 times of a non-treated material and enough treatment effect was obtained.

Experimental example 2

Ions were implanted by the device shown in FIGS. 6 and 7 in accordance to the method of the present invention.

That is, a lead-in tube made of BN (BN: boron nitride) with 1 cm of inner diameter was inserted to a non-magnetic iron fine tube having 3 cm of inner diameter and a voltage of $-50$ kV was applied to the fine tube in order to implant monovalent nitrogen ions vertically to the inner wall of the fine tube by 50 keV of acceleration voltage.

The hardness of the surface treated at this time was about Hv 300 which is about 1.5 times of a non-treated material and enough treatment effect was obtained.

What is claimed is:

1. An ion implantation method for implanting ions by irradiating an ion beam on the surface of the inner periphery of a hole, characterized in that a magnetic field is applied to the inside of said hole to deflect said ion beam and to irradiate it on the surface of the inner periphery of said hole with an incident angle at or close to right angles.

2. An ion implantation method according to claim 1, wherein said magnetic field is applied to the inside of said hole by a superconductive magnet.

3. An ion implantation method according to claim 1, wherein said magnetic field is applied to the inside of said hole by a composite type high magnetic field magnet composed of a superconductive magnet and normal conductive magnet.

4. An ion implantation method for implanting ions by irradiating an ion beam on the surface of the inner periphery of a hole, characterized in that said ion beam is irradiated on the surface of the inner periphery of said hole with an incident angle at or close to right angles by inserting a lead-in tube for said ion beam to the inside of said hole and by deflection said ion beam by applying a voltage having a reverse potential to the ions on the inner surface of said hole.

5. An ion implantation method according to claim 4, wherein a voltage having the same potential with the ions is applied to said lead-in tube.

6. An ion implantation method according to claim 5, wherein an edge of said lead-in tube is bent in one direction.

* * * * *